(12) United States Patent
Ohashi et al.

(10) Patent No.: US 10,059,552 B2
(45) Date of Patent: Aug. 28, 2018

(54) FEEDER

(71) Applicant: FUJI CORPORATION, Chiryu (JP)

(72) Inventors: Hiroyasu Ohashi, Toyota (JP); Hiroki Murase, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/314,752

(22) PCT Filed: May 30, 2014

(86) PCT No.: PCT/JP2014/064444
§ 371 (c)(1),
(2) Date: Nov. 29, 2016

(87) PCT Pub. No.: WO2015/181959
PCT Pub. Date: Dec. 3, 2015

(65) Prior Publication Data
US 2017/0183176 A1 Jun. 29, 2017

(51) Int. Cl.
*B65H 20/20* (2006.01)
*H05K 13/02* (2006.01)

(52) U.S. Cl.
CPC ............ *B65H 20/20* (2013.01); *H05K 13/02* (2013.01)

(58) Field of Classification Search
CPC ......... B65H 20/20; B65H 20/22; H05K 13/02
See application file for complete search history.

(56) References Cited

U.S. PATENT DOCUMENTS

2011/0243695 A1    10/2011  Hwang et al.
2015/0223373 A1*   8/2015   Yamasaki .......... H05K 13/0417
                                              226/76
2015/0296669 A1*  10/2015   Kitani ................. H05K 13/021
                                              221/71

FOREIGN PATENT DOCUMENTS

JP    2011-77096 A    4/2011
JP    2011-211169 A   10/2011
JP    2014-82454 A    5/2014

OTHER PUBLICATIONS

International Search Report dated Aug. 12, 2014 in PCT/JP14/064444 Filed May 30, 2014.

* cited by examiner

*Primary Examiner* — Michael C McCullough
(74) *Attorney, Agent, or Firm* — Oblon, McClelland, Maier & Neustadt, L.L.P.

(57) ABSTRACT

A feeder for which carrier tape is reliably inserted to a specified position, the feeder including entrance retaining member that pushes carrier tape inserted into tape insertion section towards tape feeding path, rotatable lever that raises entrance retaining member when carrier tape is inserted into tape insertion section, and stopper member that regulates the insertion position of the carrier tape inserted into tape insertion section to a specified position when entrance retaining member is raised by the rotation of lever.

6 Claims, 9 Drawing Sheets

# FEEDER

TECHNICAL FIELD

The present application relates to a feeder for feeding carrier tape in which components are stored.

BACKGROUND ART

A feeder capable of continuously feeding carrier tape to a component pickup position without splicing is disclosed in patent literature 1, and by using this feeder, splicing work when components run out becomes unnecessary, thus stoppages of component mounters due to splicing do not occur.

CITATION LIST

Patent Literature

PTL 1: JP-A-2011-77096

SUMMARY

For this type of component mounter for which splicing work is unnecessary, conventionally, insertion of the carrier tape is detected by a sensor, and by this, a sprocket is driven and the carrier tape is automatically loaded. However, there are cases in which inserted carrier tape does not stop at the specified position and becomes inserted too far, such that insertion of the carrier tape cannot be detected by the sensor.

The present application take account of the above problems and an object thereof is to provide a feeder that regulates the insertion position of carrier tape to be a specified position.

To solve the above problems, an aspect of the disclosure comprises a tape feeding path for feeding carrier tape that stores many components; a tape insertion section that is provided on a rear section of a feeder main body and into which the carrier tape is inserted; a sprocket that is rotatably provided on the feeder main body and that includes an engaging protrusion engageable with an engaging hole of the carrier tape inserted into the tape insertion section; a motor that rotates the sprocket; an entrance retaining member that presses the carrier tape inserted into the tape insertion section towards the tape feeding path; a rotatable lever that raises the entrance retaining member when the carrier tape is inserted into the tape insertion section; and a stopper member that regulates the insertion position of the carrier tape inserted into the tape insertion section to be a specified position when the entrance retaining member is raised by the rotation of the lever.

According to an aspect of the disclosure, because a stopper that regulates the insertion position of the carrier tape to be a specified position when the entrance retaining member is raised by the rotation of the lever, it is possible to reliably regulate the insertion position of the carrier tape to be the specified position by the stopper member operated by the rotation of the lever.

DESCRIPTION OF EMBODIMENTS

Figure 1:
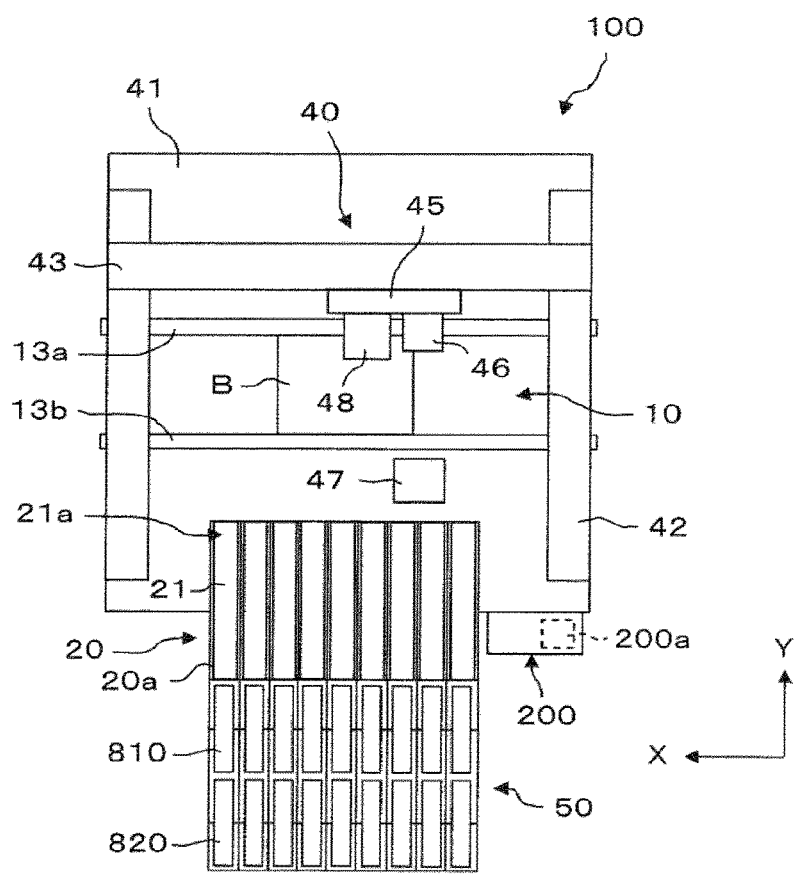
FIG. 1 is an overall plan view of a component mounter that is a suitable embodiment of the present disclosure.

An embodiment of the present disclosure is described below with reference to the figures. FIG. 1 shows component mounter 100 provided with feeders 21; component mounter 100 includes board conveyance section 10, component supply section 20, component mounting section 40, reel holding section 50, and control device 200 that controls those items.

In the following description, the X-axis direction refers to the conveyance direction of boards, and the Y-axis direction refers to the horizontal direction orthogonal to the X-axis direction.

Component supply section 20 is formed from multiple slots 20a and multiple feeders 21 which are detachably mounted to each of the slots 20a. Slots 20a are provided in component supply section 20 lined up in parallel in the X-axis direction.

Reel holding section 50 holds, in an exchangeable manner, first reel 810 and second reel 820 on which carrier tapes 900 are wound. First reel 810 and second reel 820 are arranged adjacent to each other in the Y direction, and multiple of the reels are arranged in the X direction corresponding to each of the feeders 21.

Figure 2:
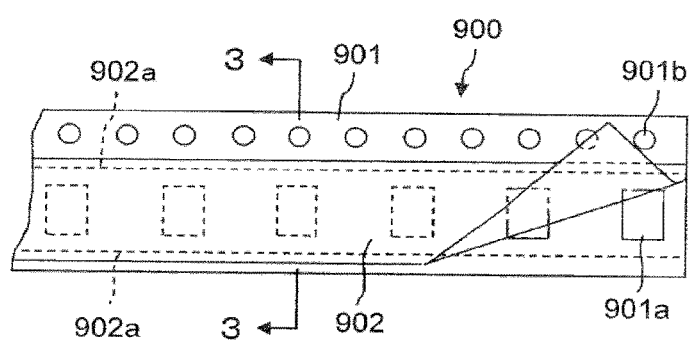
FIG. 2 is a plan view of carrier tape.
Figure 3:
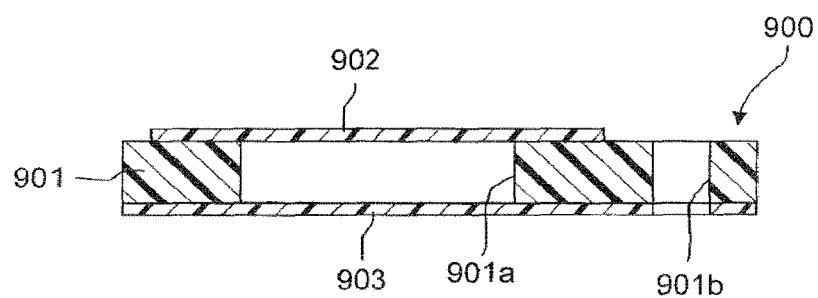
FIG. 3 is a cross section of the carrier tape shown in FIG. 2 at line 3-3.

Carrier tape 900 stores many components such as electronic components in a row. As shown in FIG. 2 and FIG. 3, carrier tape 900 is formed of base tape 901, cover tape 902, and bottom tape 903. Base tape 901 is formed of a flexible material such as a paper material or a resin. Storage sections 901a, which are cavities, are formed as through-holes in a center portion of base tape 901 in the width direction at a fixed interval in the length direction. Components are stored in storage sections 901a. Engagement holes 901b are formed as through-holes in a side portion of the base tape 901 at a fixed interval in the length direction.

Both side portions of cover tape 902 are adhered to both side portions of the top surface of base tape 901 using an adhesive 902a (refer to FIG. 2), and usually cover the upper section of storage section 901a so as to prevent components from jumping out. Note that, cover tape 902 is formed of a transparent polymer film.

As illustrated in FIG. 3, bottom tape 903 is adhered to the bottom surface of base tape 901. Components which are stored in storage sections 901a are prevented from falling out by bottom tape 903. Bottom tape 903 is formed of a paper material, a polymer film or the like and is transparent or semi-transparent.

Carrier tapes 900 wound on first reel 810 and second reel 820 are able to be inserted into each feeder 21. The carrier tape 900 wound on one of the reels, reel 810 (reel 820), is sequentially indexed by feeder 21 to component pickup position 21a provided at the tip section of feeder 21. By this, a component held in the carrier tape 900 is positioned at component pickup position 21a. Further, carrier tape 900 which is wound on the other reel, reel 820 (reel 810), stands by without being supplied by feeder 21.

Note that, below, to facilitate description, in order to distinguish between carrier tape 900 which is being indexed (in use) and carrier tape which is standing by, there are cases in which the former is referred to as a first carrier tape 900A and the latter is referred to as a second carrier tape 900B. In these cases, since the second carrier tape becomes the first carrier tape after all of the components which are stored in the first carrier tape are used, the terms first carrier tape and second carrier tape do not indicate a specific carrier tape.

In board conveyance section 10, a pair of guide rails 13a and 13b are provided respectively on base 41 of component mounting section 40. Also, conveyor belts, omitted from the drawings, that support and convey a printed circuit board B which is guided by both of the guide rails 13a and 13b, and a clamp device, omitted from the drawings, that raises board B that has been conveyed to a specified position, are provided in board conveyance section 10.

Board B on which components are to be mounted is conveyed in the X-axis direction to a component mounting position by the conveyor belts while being guided by guide rails 13a and 13b of board conveyance section 10. Printed circuit board B which is conveyed to the component mounting position is positioned and clamped in the component mounting position by the clamp device.

As shown in FIG. 1, component mounting device 40 includes guide rail 42, Y-axis slide 43, X-axis slide 45, and component mounting head 48 that holds a suction nozzle, which is not depicted in the drawings. The movement of Y-axis slide 43 and X-axis slide 45 in the Y-axis direction and the X-axis direction is controlled by a Y-axis servo motor and an X-axis servo motor, which are omitted from the drawings.

A Y-axis robot is formed by guide rail 42 and Y-axis slide 43. Guide rail 42 is mounted in the Y-axis direction above base 41 and is arranged to be above board conveyance section 10. Y-axis slide 43 is provided to be capable of moving in the Y-axis direction along guide rail 42. Y-axis slide 43 is moved in the Y-axis direction via a ball screw mechanism by the Y-axis servo motor, which is omitted from the drawings.

An X-axis robot is formed by X-axis slide 45. X-axis slide 45 is provided to be capable of moving in the X-axis direction on Y-axis slide 43. An X-axis servo motor which is omitted from the drawings is provided on Y-axis slide 43. X-axis slide 45 is moved in the X-axis direction via a ball screw mechanism by the X-axis servo motor.

Component mounting head 48 is provided on X-axis slide 45. Component mounting head 48 holds multiple suction nozzles (not illustrated in the drawings) in a detachable manner. The suction nozzle picks up a component fed to component supply position 21a and mounts the component on board B, which is positioned at the component mounting position by board conveyance section 10.

Board camera 46 is attached to X-axis slide 45. Board camera 46 images fiducial mars that are provided on board B positioned at the board mounting position, or a component or the like which supplied to component supply position 21a, from above, and acquires board position fiducial information, component position information, and the like.

Component camera 47 capable of imaging a component which has been picked up by the suction nozzle from beneath is provided on base 41.

Next, the configuration of feeder 21 is described with reference to FIGS. 4 to 6. Feeder 21 is configured mainly from feeder main body 21b, first servo motor 22, second servo motor 23, first gear 24, second gear 25, third gear 26, fourth gear 27, stopper member 31, entrance retaining member 32, downstream-side retaining member 33, operation lever 51, first sprocket 61 and second sprocket 62 as front-side sprockets, third sprocket 63 and fourth sprocket 64 as rear-side sprockets, rail 38 as a tape feeding path, control section 39, tape peeling device 70, and the like.

Figure 7:
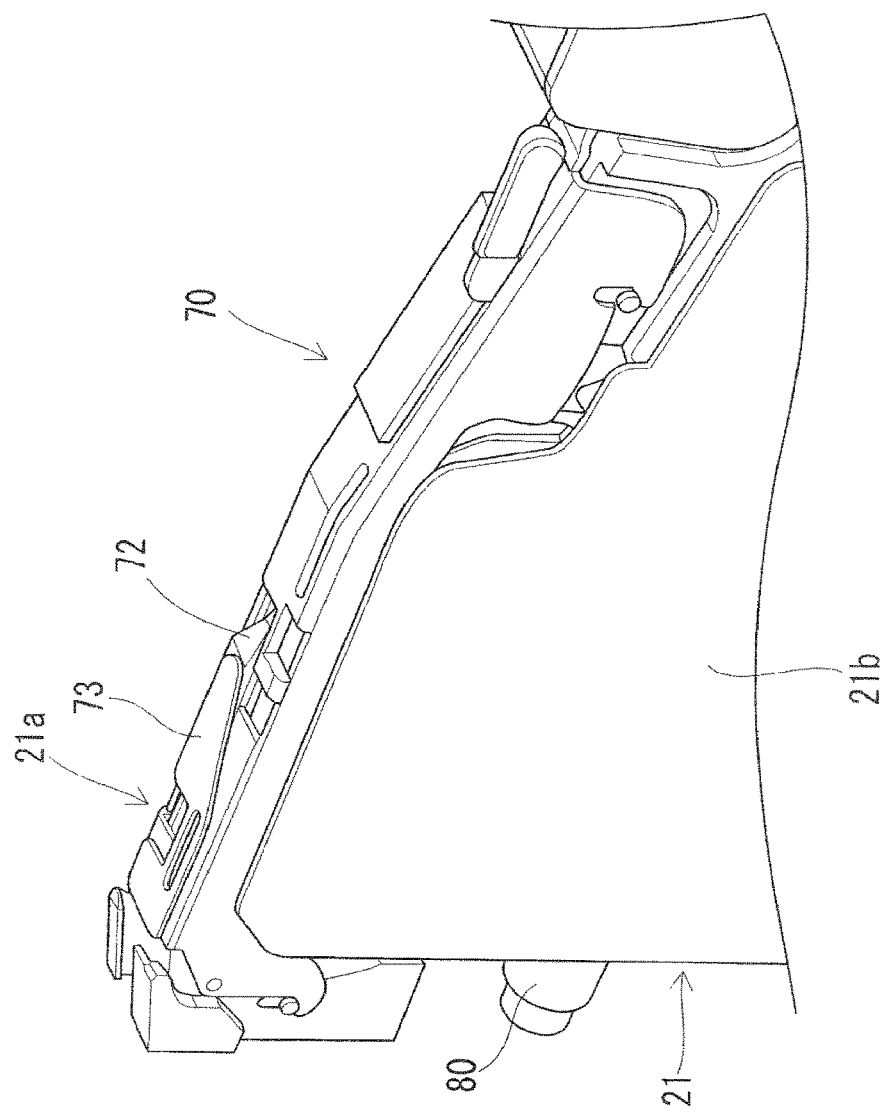
FIG. 7 shows a tape peeling device provided on the feeder.

As shown in FIG. 7, tape peeling device 70 is provided on an upper section of feeder main body 21b, and peels cover tape 902 from carrier tape 900 such that a component is able to be removed from storage section 901a positioned at component pickup position 21a. Tape peeling device 70 is configured from peeling member 72 that peels cover tape 902, and folding member 73 that lifts up and folds over an edge section of peeled cover tape 902.

Feeder 21 is mounted onto component supply section 20 by being inserted into slot 20a from the front. Feeder main body 21b is a flat box shape. Note that, FIGS. 4 and 5 are diagrams with a side wall of feeder main body 21b removed to show the internal structure of feeder 21. Also, FIG. 6 shows only a portion of operation lever 51, cam section 51c.

Figure 4:
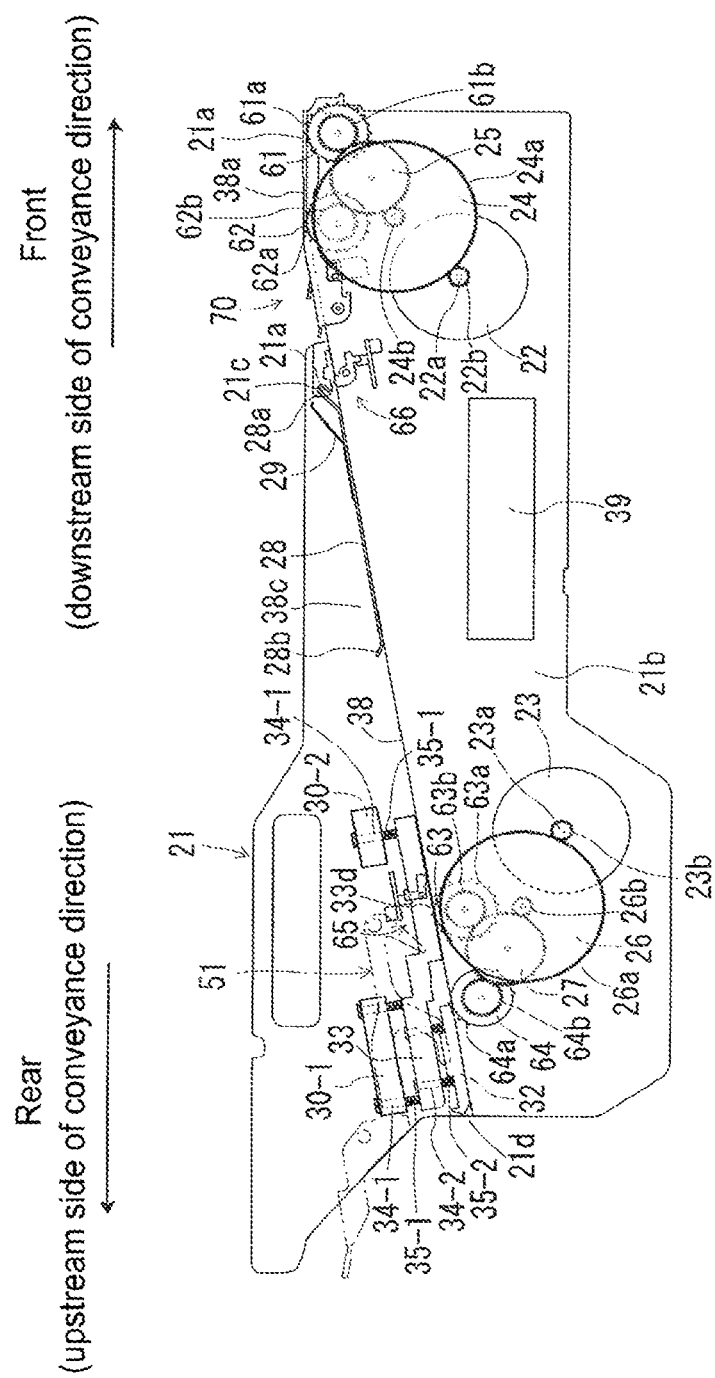
FIG. 4 is a cutaway side view of a feeder of an embodiment of the present disclosure.

In FIG. 4, rail (tape feeding path) 38 is for guiding the feeding of carrier tape 900, and is thus arranged from tape insertion section 21d provided at the rear section of feeder main body 21b to component pickup position 21a at the front section. Front section 38a of tape feeding path 38 is formed to be horizontal. In the present embodiment, tape feeding path 38 is inclined to gradually increase in height from the rear section to before front section 38a. Note that, although not depicted in the drawings, guide members that are separated by a dimension which is slightly greater than the width dimension of carrier tape 900 are provided on both sides of tape feeding path 38.

Each of first sprocket 61 and second sprocket 62 is provided, to be capable of rotating, from the front toward the rear (from the downstream side to the upstream side in the feeding direction) in feeder main body 21b beneath front section 38a of tape feeding path 38, that is, in positions adjacent to component pickup position 21a of feeder main body 21b. Each of third sprocket 63 and fourth sprocket 64 is provided, to be capable of rotating, from the front toward the rear in feeder main body 21b beneath the rear section of tape feeding path 38.

Engaging protrusions 61a, 62a, and 63a are formed at a fixed angle all the way around the outer circumferences of first sprocket 61, second sprocket 62, and third sprocket 63, respectively. Fourth engaging protrusions 64a are formed at an interval of 180 degrees on a portion of the outer circumference of fourth sprocket 64. That is, between each engaging protrusion 64a of fourth sprocket 64, there is a portion where no engaging protrusions are formed. Each of the engaging protrusions 61a to 64a is able to engage with engagement holes 901b of carrier tape 900.

First sprocket near 61b, second sprocket gear 62b, third sprocket gear 63b, and fourth sprocket gear 64b are respectively formed closer to the inside than the outer circumference of the first sprocket 61 to the fourth sprocket 64. A window, not shown in the drawings, is provided in tape feeding path 38 above each sprocket 61 to 64, and each engaging protrusion 61a to 64a penetrates through tape feeding path 38 through this window.

First servo motor 22 rotates first sprocket 61 and second sprocket 62. First drive gear 22b is provided on rotating shaft 22a of the first servo motor 22. First gear 24 is rotatably provided on main body 21b beneath first sprocket 61 and second sprocket 62. First outside gear 24a that meshes with first drive gear 22b is formed on the outer circumference of first gear 24. First inside gear 24b is formed closer to the inside than the outer circumference of first gear 24.

Second gear 25 is rotatably provided on main body 21b between first sprocket 61 and second sprocket 62, and first gear 24. Second gear 25 meshes with first sprocket gear 61b, second sprocket gear 62b, and first inside gear 24b. According to such a configuration, the rotation speed of first servo motor 22 is reduced and transmitted to first sprocket 61 and second sprocket 62, and, first sprocket 61 and second sprocket 62 rotate in synchronization.

Second servo motor 23 rotates third sprocket 63 and fourth sprocket 64. Second drive gear 23b is provided on rotating shaft 23a of second servo motor 23. Third gear 26 is rotatably provided on main body 21b beneath third sprocket 63 and fourth sprocket 64. Third outside gear 26a that meshes with second drive gear 23b is formed on the outer circumference of third gear 26. Third inside gear 26b is formed closer to the inside than the outer circumference of third gear 26.

Fourth gear 27 is rotatably provided on main body 21b between third sprocket 63 and fourth sprocket 64, and third gear 26. Fourth gear 27 meshes with third sprocket gear 63b, fourth sprocket gear 64b, and third inside gear 26b. According to such a configuration, the rotation speed of second servo motor 23 is reduced and transmitted to third sprocket 63 and fourth sprocket 64, and, third sprocket 63 and fourth sprocket 64 rotate in synchronization.

Entrance retaining member 32 is arranged along the upper surface of the rear section of tape feeding path 38 close to tape insertion section 21d, and is detachable from tape feeding path 38. Entrance retaining member 32 is attached so as to be movable in a vertical direction via pair of shafts 34-2 downwards from, the rear section of downstream-side retaining member 33. Springs 35-2 that bias entrance retaining member 32 downward are attached to pair of shafts 34-2.

Downstream-side retaining member 33 pushes on carrier tape 900 at the downstream side to entrance retaining member 32, and is detachable from tape retaining path 38. Downstream-side retaining member 33 is attached to first support member 30-1 and second support member 30-2, which are attached to main body 21b, via shaft 34-1 so as to be capable of moving in the vertical direction. Spring 35-1 that biases downstream-side retaining member 33 downward is attached to shaft 34-1.

Figure 5:
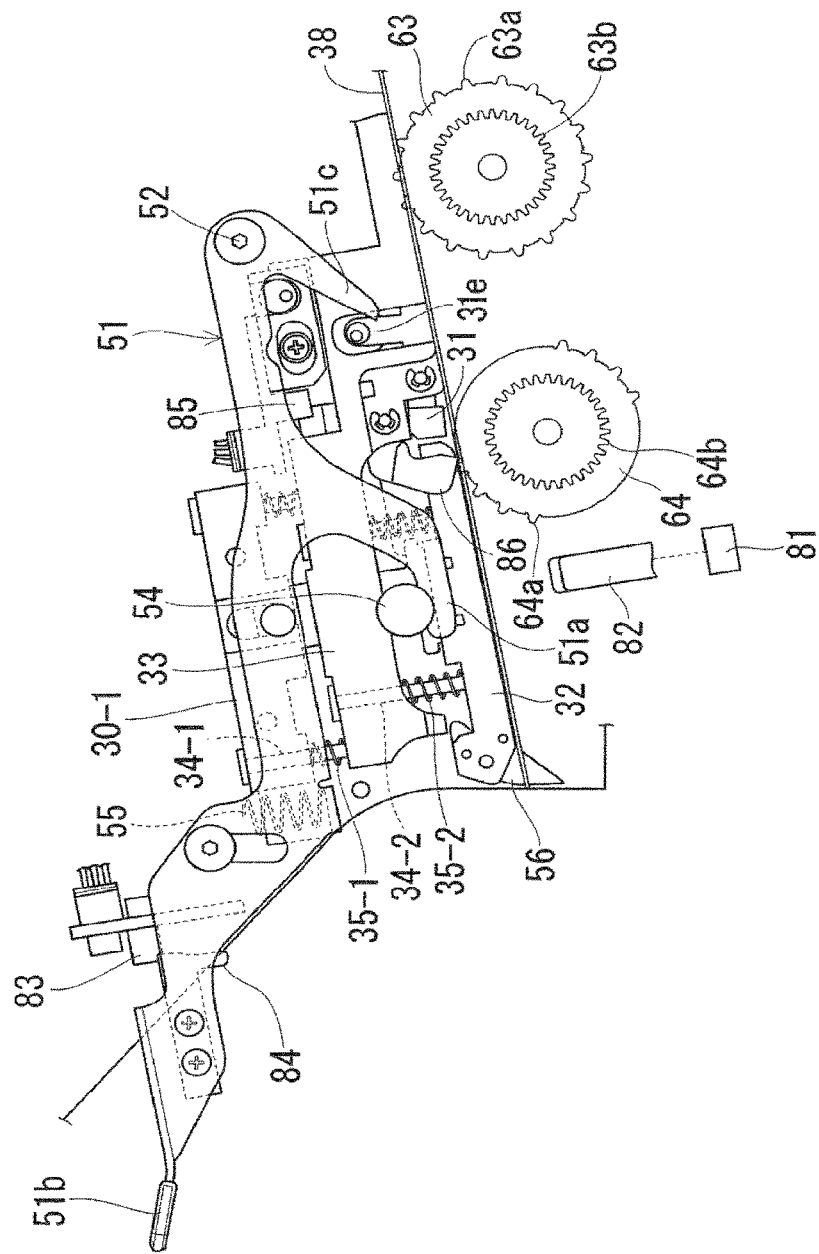
FIG. 5 is a detailed view of an enlarged portion of FIG. 4.

As shown in FIG. 5, operation lever 51 is supported on the rear section of feeder main body 21b so as to be rotatable around pivot 52. As described later, entrance retaining member 32 is operationally connected to operation lever 51. Entrance retaining member 32 pushes carrier tape 900 inserted into tape insertion section 21d towards tape feeding path 38. Engaging member 54 is provided on entrance retaining member 32 between pair of shafts 34-2.

Operation engaging section 51a that engages with the lower surface of engaging member 54 of entrance retaining member 32 is formed in the central section of operation lever 51. Operation lever 51 is rotated in a counterclockwise direction in FIG. 5 by the biasing force of spring 55, and usually operation engaging section 51a is held at a lower position, with entrance retaining member 32 contacting tape feeding path 38 due to the biasing force of springs 35-2. Thus, usually, carrier tape 900 is unable to be inserted into tape insertion section 21d due to entrance retaining member 32.

However, when operation knob 51b provided an the rear end of operation lever 51 is raised by an operator, operation lever 51 is rotated against the biasing force of spring 55, such that entrance retaining member 32 is raised against the biasing force of springs 35-2 by operation engaging section 51a. By this, entrance retaining member 32 is raised up and separated from tape feeding path 38, such that carrier tape 900 is able to be inserted into tape insertion section 21d.

Figure 8:
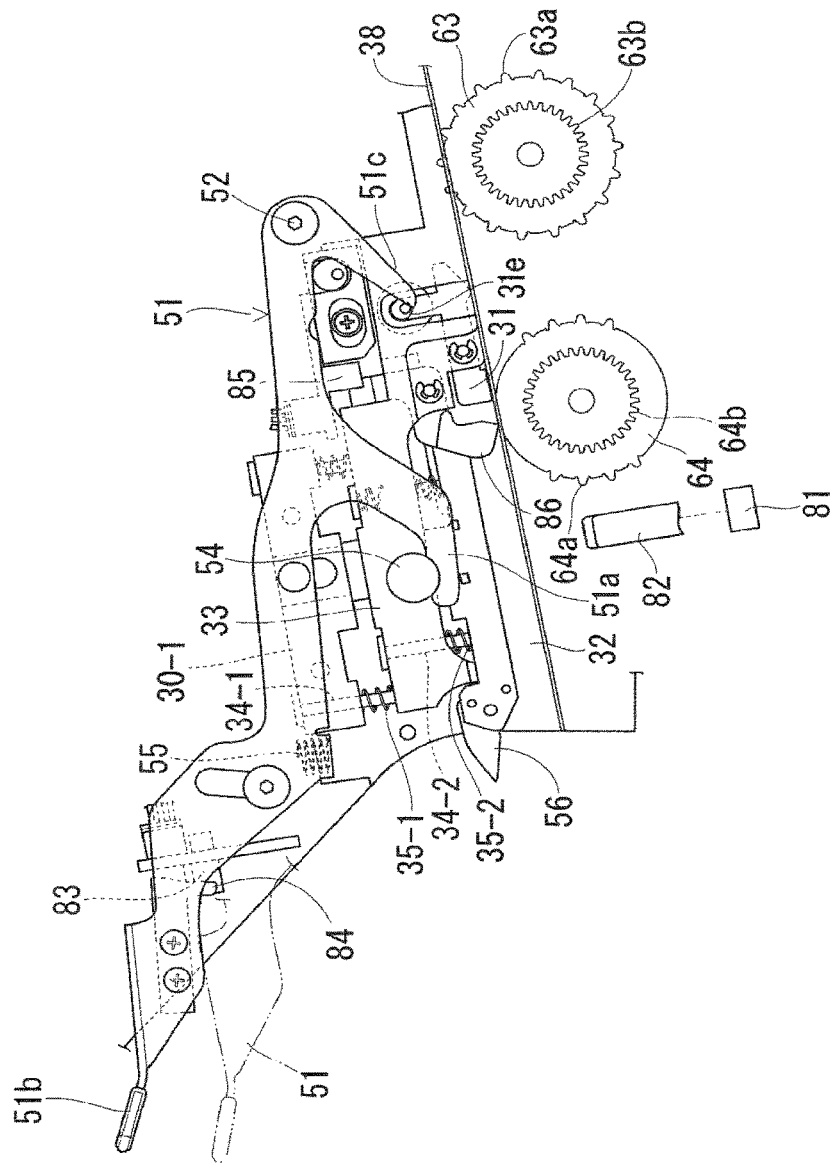
FIG. 8 shows an operating state of FIG. 5 in which the operation lever is in a raised state.

Obstructing plate 56 that covers tape entrance section 21d is hinged on the rear section of entrance retaining member 32. Obstructing plate 56 prevents carrier tape 900 from being able to be inserted between tape feeding path 38 and entrance retaining member 32. Note that, when entrance retaining member 32 is raised, as shown in FIG. 8, obstructing plate 56 engages with the rear section of downstream-side retaining member 33 and rotates to open tape entrance section 21d.

Stopper member 31 is provided adjacent to and contacting the downstream side of entrance retaining member 32. Stopper member 31 is able to rotate by shaft support section 31b (refer to FIG. 6) provided in the central portion of stopper member 31 being supported downstream-side retaining member 33. Abutting section 31a is form protruding downward on the bottom portion of stopper member 31 closer to the front than shaft support portion 31b. The rear end of stopper member 31 is stopping section 31c.

Spring 36 (refer to FIG. 6) that biases abutting section 31a to contact tape feeding path 38 is attached between downstream-side retaining member 33 and stopper member 31. Protruding section 31d that protrudes up is formed on the upper section of stopper member 31 further to the front than shaft support section 31b, and cam follower 31e is provided on the end of protruding section 31d. Cam section 51c formed in the front section of operation lever 51 is able to engage with and separate from cam follower 31e.

Operation lever 51 is held by the biasing force of spring 55 in a position such that entrance retaining member 32 contacts tape feeding path 38, and cam section 51c formed on operation lever 51 is separated from cam follower 31e of stopper member 31. By this, stopper member 31 is rotated clockwise as in FIG. 6 around shaft support section 31b by the biasing force of spring 36, such that abutting section 31a contacts tape feeding path 38 and stopping section 31c is held at a position separated from tape feeding path 38.

Figure 6:
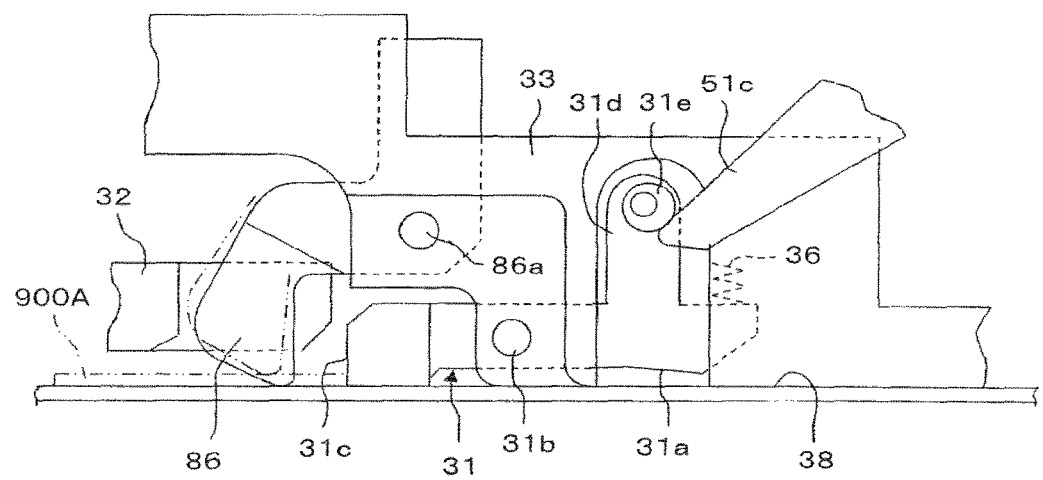
FIG. 6 shows a state with carrier tape stopped at a specified position.

On the other hand, when operation lever 51 is rotated against the biasing force of spring 55, cam section 51c formed on operation lever 51 engages with cam follower 31e of stopper member 31 so as to rotate stopper member 31 in a counterclockwise direction as in FIG. 6 against the biasing force of spring 36 such that stopping section 31c contacts tape feeding path 38.

By this, in a state with operation lever 51 rotated against the biasing force of spring 55, when first carrier tape 900A is inserted into tape insertion section 21d, as shown by the two-dotted dashed line in FIG. 6, the leading end of first carrier tape 900A contacts stopping section 31c of stopper member 31 so as to be stopped at a specified position.

Note that, when first carrier tape 900A passes between abutting section 31a of stopper member 31 and tape feeding path 38, abutting section 31a is raised by first carrier tape 900A and abutting member 31a of stopper member 31 contacts tape feeding path 38.

Thus, in this state, when second carrier tape 900B is inserted by an operator into tape insertion section 21d on top of first carrier tape 900A, as shown in FIG. 5, the leading end of carrier tape 900B is stopped by contacting stopping section 31c of stopper member 31. By this, feeding downstream of second carrier tape 900B is prevented and second carrier tape 900B stands by at that position.

First sensor 81 that detects when first carrier tape 900A is inserted into tape insertion section 21d is attached to feeder main body 21b. First sensor 81 turns on by first dog 82 that protrudes from the lower surface of tape feeding path 38 being lowered by the insertion of first carrier tape 900A. First dog 82 is usually held in a position protruding from the lower surface of tape feeding path 38 by the biasing force of a spring, not shown, and is pressed down when first carrier tape 900A is inserted.

Further, second sensor 83 that detects that operation lever 51 has been rotated, and third sensor 85 that operates when second carrier tape 900B is fed on tape feeding path 38 above fourth sprocket 64, are attached to feeder main body 21b.

Second sensor 83 is turned on by second dog 84 attached to operation lever 51. Third sensor 85 is turned on by the rotation of third dog 86. Third dog 86 is able to rotate by shaft support section 86a provided in the central portion of third dog 86 being supported by downstream-side retaining member 33. Third dog 86 is usually biased in a counter-clockwise direction as in FIG. 6 by a spring, which is not shown. By this, the leading end of third dog 86 contacts the upper surface of tape feeding path 38 when there is no carrier tape 900 on tape feeding path 38, and leading end of third dog 86 contacts the upper surface of first carrier tape 900A when there is a first carrier tape 900A on tape feeding path 38 (refer to the two-dotted dashed line in FIG. 6).

As shown in FIG. 4, lifting prevention member 28 is provided along the top of tape feeding path 38 between third sprocket 63 and second sprocket 62. Shaft support portion 28a is formed on the front end of lifting prevention member 28, and shaft support portion 28a is axially supported on shaft portion 21c that is provided in main body 21b, and, lifting prevention member 28 is attached to main body 21b to be capable of rocking. Guide section 28b, which is bent upward, is formed on the rear end of lifting prevention member 28. Torsion spring 29 is attached to main body 21b above lifting prevention member 28 and biases lifting prevention member 28 downward. The bottom surface of lifting prevention member 28 comes into close contact with the top surface of ape feeding path 38 due to torsion spring 29.

Note that, space 38c is formed above tape feeding path 38 between second sprocket 62 and third sprocket 63.

Control device 200 controls feeder 21 and controls the rotation of first servo motor 22 and second servo motor 23. Control device 200 includes a microprocessor and a driver that supplies the drive currents to servo motors 22 and 23.

Fourth sensor 65 that detects the presence or absence of carrier tape 900 and outputs that detection signal to control section 39 is provided in main body 21b on the downstream side of third sprocket 63 (the rear end side of feeder 21). Fourth sensor 65 is a sensor that detects a boundary portion between first carrier tape 900A and second carrier tape 900B. Fifth sensor 66 that detects the presence or absence of carrier tape 900 and outputs that detection signal to control section 39 is provided in main body 21b on the upstream side of second sprocket 62 (the front end side of feeder 21).

When feeder 21 is inserted into slot 20a of component supply section 20, electric power is supplied to feeder 21 from the main body side of component mounter 100 via communication connector 80 (refer to FIG. 7), and required information such as the feeder ID is sent from feeder 21 to control device 200 of component mounter 100. By this, information of the component fed by carrier tape 900 mounted in feeder 21 is acquired based on the serial ID of feeder 21 and stored in control device 200.

Described next, is operation of feeder 21 of the above embodiment. Normally, operation lever 51 is held in the position shown in FIG. 5 by the biasing force of spring 55, entrance retaining member 32 contacts tape feeding path 38, and obstructing plate 56 rotates under its own weight to cover tape entrance section 21d.

Here, first carrier tape 900A is wound around front-side reel 810, and second carrier tape 900B is wound around rear-side reel 820.

In this state, operation knob 51b of operation lever 51 is raised by an operator. When operation lever 51 is raised, second sensor 83 is operated by second dog 84 to detect operation of operation lever 51.

Entrance retaining member 32 is raised by the rotation of operation lever 51 via operation engaging section 51a. By this, entrance retaining member 32 is separated from tape feeding path 38, and obstructing plate 56 is rotated by downstream-side retaining member 33 (refer to FIG. 8). As a result, tape insertion section 21d is opened, and carrier tape 900 is able to be inserted. At the same time, by the rotation of operation lever 51, stopper member 31 is rotated by cam section 51c, and stopping section 31c contacts tape feeding path 38.

In this state, first carrier tape 900A is inserted by an operator onto tape feeding path 38 via tape insertion section 21d, and first carrier tape 900A is inserted to the specified position contacting stopping section 31c of stopper member 31 (refer to the two-dotted dashed line in FIG. 6). By this, because first dog 82 and third dog 86 are operated by first carrier tape 900A, first sensor 81 and third sensor 85 are activated such that it is detected that first carrier tape 900A has been inserted to the specified position.

When first carrier tape 900A is inserted to a position contacting stopping section 31c, operation of operation lever 51 is released, and operation lever 51 rotates, returning to its original position as shown by a solid line in FIG. 5 due to the biasing force of spring 55. By the return of operation lever 51, entrance retaining member 32 is lowered towards tape feeding path 38, and the inserted first carrier tape 900A is pressed towards tape feeding path 38.

When the insertion of first carrier tape 900A is detected and the return of operation lever 51 to its original position is detected (sensor 83 is off), second servo motor 23 is driven such that third and fourth sprockets 63 and 64 rotate. By this, engaging protrusion 64a of fourth sprocket 64 engages with engaging hole 901b of first carrier tape 900A, and first carrier tape 900A is fed by fourth sprocket 64 to the third sprocket 63 side.

Due to the feeding of first carrier tape 900A by fourth sprocket 64, downstream-side retaining member 33 is raised by first carrier tape 900A against the biasing force of spring 35-1, and first carrier tape 900A is fed between downstream-side retaining member 33 and tape feeding path 38.

In this case, because engaging protrusions 64a of fourth sprocket 64 are only formed in a portion of the outer circumference of fourth sprocket 64, when engaging protrusions 64a engage with engaging hole 901b of first carrier tape 900A, first carrier tape 900A is moved intermittently to the third sprocket 63 side. As a result, first carrier tape 900A is not suddenly taken up to the third sprocket 63 side. Note that, when downstream-side retaining member 33 is raised by first carrier tape 900A, shaft support sections 31b and 86a of stopper member 31 and third dog 86 are raised as one body.

When engaging holes 901b formed in first carrier tape 900A fed by fourth sprocket 64 engage with engaging protrusions 63a of third sprocket 63, first carrier tape 900A is fed to the second sprocket 62 side by third sprocket 63. Because engaging protrusions 63a are formed along the entire circumference of the outer circumference of third sprocket 63, first carrier tape 900A is fed to the second sprocket 62 side in a short time.

Further, the leading end of first carrier tape 900A enters beneath lifting prevention member 28 from between guide section 28b and tape feeding path 38. The leading end of first carrier tape 900A is suppressed from lifting up from tape feeding path 38 by lifting prevention member 28 and is fed to second sprocket 62.

When fifth sensor 66 detects the leading end of first carrier tape 900A conveyed thereto by third sprocket 63, first servo motor 22 and second servo motor 23 intermittently rotate sprockets 61 to 64 by the component pitch. When engaging holes 901b formed in first carrier tape 900A engage with engaging protrusions 62a of second sprocket 62, first carrier tape 900A is fed to tape peeling device 70 by second sprocket 62 and cover tape 902 is peeled from first carrier tape 900A by tape peeling device 70. Then, when engagement holes 901b formed in first carrier tape 900A engage with engaging protrusions 61a of first sprocket 61, components stored in first carrier tape 900A are sequentially positioned at component pickup position 21a by first sprocket 61.

Figure 9:
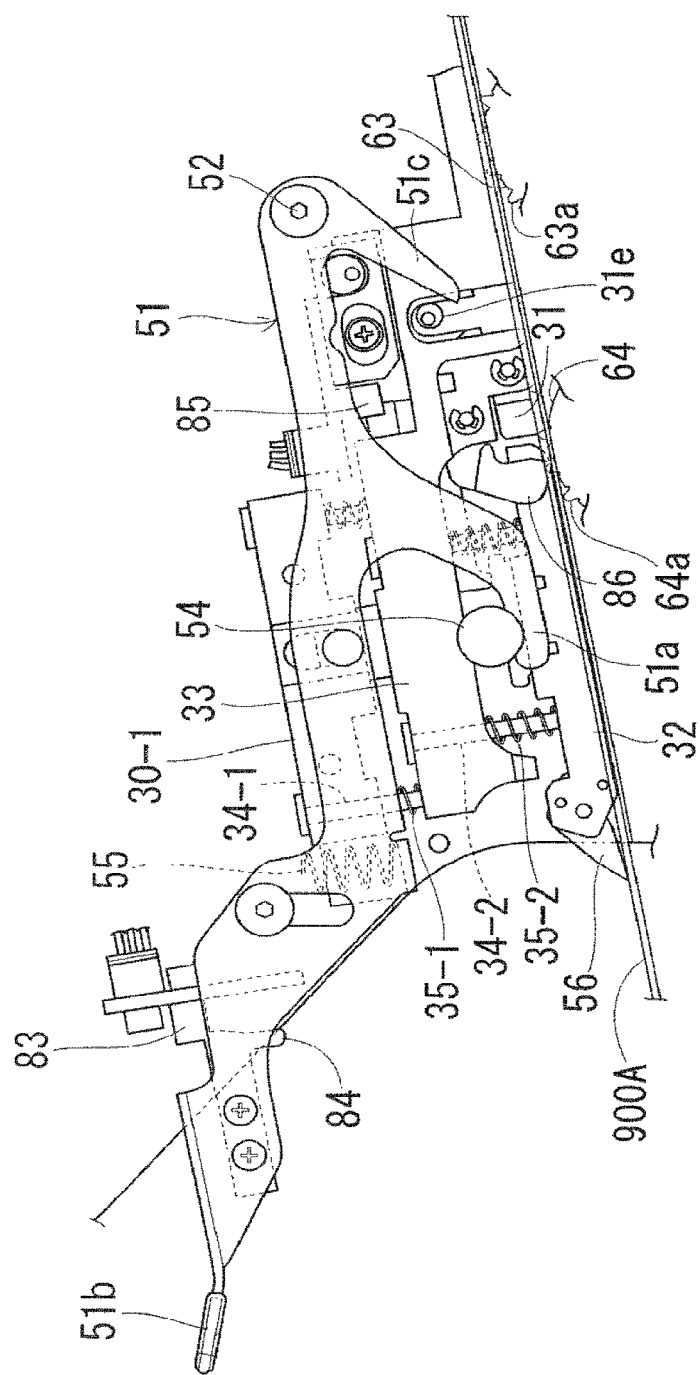
FIG. 9 shows an operating state of FIG. 5 in which the carrier tape is being fed.

When first carrier tape 900A is fed by feeder 21, as shown in FIG. 9, first carrier tape 900A presses on abutting section 31a of stopper member 31 such that stopper member 31 rotates against the biasing force of spring 36. By this, stopping section 31 of stopper member 31 contacts the upper surface of first carrier tape 900A.

Accordingly, in this state, as described above, when operation lever 51 is rotated (second sensor 83 turns on) and second carrier tape 900B is inserted into tape insertion section 21d between first carrier tape 900A and insertion retaining member 32, the leading end of second carrier tape 900B contacts stopping section 31c of stopper member 31 and stops at that position. By this, feeding downstream of second carrier tape 900B is prevented and second carrier tape 900B stands by at that position.

After the insertion of second carrier tape 900B, when operation of operation lever 51 is released, operation lever 51 returns to its original position, but because first carrier tape 900A is pressed against abutting section 31a of stopper member 31, second carrier tape 900B remains in a stopped state due to stopping section 31c of stopper member 31.

Note that, even if second carrier tape 900B is inserted into tape insertion section 21d without rotating operation lever 51, the insertion of second carrier tape 900B is prevented by obstructing plate 56 that contacts the upper surface of first carrier tape 900A (refer to FIG. 9).

When second carrier tape 900B has been inserted into tape insertion section 21d on top of first carrier tape 900A to a position contacting stopping section 31c of stopper member 31, because third dog 86 is operated by second carrier tape 900B, the insertion of second carrier tape 900B is detected by third sensor 85. However, if third sensor 85 turns on even though second carrier tape 900B has not been inserted, an incorrect determination that second carrier tape 900B has been inserted may be performed.

This is because third sensor 85 may turn on and off due to behavior of first carrier tape 900A, for example, undulation while being fed, because until the insertion of second carrier tape 900B, third sensor 85 contacts the upper surface of first carrier tape 85.

With regard to this, in the present embodiment, a signal of second sensor 83 that is turned on by raising operation of operation lever 51 is sent to control device 200, and by this, a notice is provided that second carrier tape 900B will subsequently be inserted.

Then, when second sensor 83 switches from on to off and third sensor 85 turns on, the on signal of third sensor 85 is sent to control device 200, and insertion of second carrier tape 900B is determined by determining control section 200a (refer to FIG. 1) of control device 200. By this, incorrect determination due to operation of third sensor 85 leading from behavior and so on of first carrier tape 900A is prevented, and insertion of second carrier tape 900B is reliably detected.

Note that, when third sensor 85 is turned on, it is possible to determine whether first carrier tape 900A second carrier tape 900B has been inserted based on the change or otherwise in the operation state of first sensor 81. That is, if second carrier tape 900B has been inserted, first sensor 81 is already on, so there is no change in the operation state.

When the trailing end of first carrier tape 900A is fed downstream further than the leading end of second carrier tape 900B, engaging holes 901b formed in second carrier tape 900B engage with engaging protrusions 64a of fourth sprocket 64. Then, second carrier tape 900B progresses into the gap between tape feeding path 38 and stopper member 31 created by first carrier tape 900A, and is fed towards second sprocket 62.

Note that, when the leading end of second carrier tape 900B pushes up abutting section 31a, as described above, stopper member 31 is again rotated against the biasing force of spring 36, such that insertion of a new carrier tape 900 is presented by stopper member 31.

When all the components have been picked up from first carrier tape 900A, used reel 810 is removed from reel holding section 50.

In a case in which a new carrier tape 900 is inserted into feeder 21, the barcode on each of reel 810 onto which carrier tape 900 in use is wound (first carrier tape 900A) and reel 810 onto which newly inserted carrier tape 900 is wound (second carrier tape 900B) is read by a barcode reader, the serial ID of the components stored in each reel are sent to control device 200 of component mounter 100, and so-called verification is performed, in which it is checked whether the carrier tapes store the correct components.

According to the above embodiment, because stopper member 31 that regulates the insertion position of carrier tape 900 to be a specified position when entrance retaining member 32 is raised by the rotation of operation lever 51, it is possible to reliably regulate the insertion position of carrier tape 900 to be the specified position by stopper member 31 operated by the rotation of operation lever 51. Also, by rotating operation lever 51 back to its original position, it is possible to feed carrier tape 900.

Further, according to the above embodiment, stopping section 31c is provided on one end of stopper member 31 and abutting section 31a that is raised up by contacting the carrier tape is provided on the other end of stopper member 31, and when first carrier tape 900A contacts abutting section 31a, stopper member 31 is rotated, such that second carrier tape 900B is stopped by stopping section 30c, thus it is possible to hold second carrier tape 900B in a stopped state even when operation lever 51 is rotated back to its original position.

Also, according to the above embodiment, obstructing plate 56 that prevents the insertion of carrier tape into tape inserting section 21d is provided on entrance retaining member 32, and when entrance retaining member 32 is raised by the rotation of operation lever 51, obstructing plate 56 is moved to a position that allows the insertion of carrier tape 900 into tape insertion section 21d, thus it is possible to reliably prevent carrier tape 900 being inserted into tape insertion section 21d when operation lever 51 is in a non-rotated state, by the use of obstructing plate 56.

Even further, according to the above embodiment, because first sensor 81 that detects that first carrier tape 900A has been inserted, second sensor 83 that detects operation of operation lever 51, and third sensor 85 that detects that second carrier tape 900B has been inserted are provided, it is possible to determine whether second carrier tape 900B has been inserted by third sensor 85 turning on after second sensor 83 has turned on in a state with first sensor 81 on. Accordingly, incorrect determination due to operation of third sensor 85 leading from behavior and so on of first carrier tape 900A is prevented, and insertion of second carrier tape 900B is reliably detected.

In the above embodiment, entrance retaining member 32 is raised by the operation of operation lever 51 by operation engaging section 51a that engages with the lower surface of engaging member 54 of entrance retaining member 32 being formed on operation lever 51; however, the configuration by which operation lever 51 and entrance retaining member 32 are operational linked is not limited to that described in the embodiment, so long as the configuration is such that entrance retaining member 32 is raised in conjunction with the operation of operation lever 51.

Also, in the above embodiments, by having cam section 51c that engages with stopper member 31 formed on operation lever 51, stopper member 31 is rotated by the operation of operation lever 51; however, the configuration by which operation lever 51 and stopper member 31 are operationally linked is not limited to that described in the embodiments, so long as the configuration is such that stopper member 31 is rotated in conjunction with the operation of operation lever 51.

Further, in the above embodiments, examples were described in which front-side sprockets (first and second sprockets 61 and 62) an rear-side sprockets (third and fourth sprockets 63 and 64) are configured each as a pair of sprockets; however, each of the front-side sprocket and rear-side sprocket may be configured from at least one sprocket.

The present disclosure is not limited to the configuration described in the embodiment described above, and various embodiments may be adopted within a scope that does not depart from the gist of the present disclosure described in the claims.

INDUSTRIAL APPLICABILITY

The present disclosure of a feeder is suitable for use as an item that continuously feeds two carrier tapes to a component pickup position without splicing.

REFERENCE SIGNS LIST

21: feeder; 21a: component pickup position; 21b: feeder main body; 21d: tape insertion section; 23: motor; 31: stopper member; 31a: abutting section; 31c: stopping section; 32: entrance retaining member; 38: tape feeding path; 51: lever; 56: obstructing plate; 64: sprocket; 64a: engaging protrusion; 81: first sensor; 82: first dog; 83: second sensor; 84: second dog; 85: third sensor; 86: third dog; 90: guide section; 90a: guide surface; 100: component mounter; 200: control device; 200a: determining control section; 900: carrier tape; 901b: engaging hole

The invention claimed is:

1. A feeder comprising:
a tape feeding path for feeding carrier tape that stores many components;
a tape insertion section that is provided on a rear section of a feeder main body and into which the carrier tape is inserted;
a sprocket that is rotatably provided on the feeder main body and that includes an engaging protrusion engageable with an engaging hole of the carrier tape inserted into the tape insertion section;
a motor that rotates the sprocket;
an entrance retaining member that presses the carrier tape inserted into the tape insertion section towards the tape feeding path;
a rotatable lever configured to raise the entrance retaining member to enable insertion of the carrier tape into the tape insertion section; and
a stopper member downstream of the entrance retaining member in a tape feeding direction, the stopper member including an upstream end that contacts the tape feeding path when the entrance retaining member is raised by the rotatable lever to regulate the insertion position of the carrier tape inserted into the tape insertion section to be a specified position.

2. The feeder according to claim 1, wherein
the stopper member is axially supported at a central portion so as to be rotatable, a stopping section is at the upstream end of the stopper member, an abutting section that is raised up by contacting the carrier tape is at a downstream end of the stopper member, and when a first carrier tape contacts the abutting section, the stopper member rotates such that the second carrier tape is stopped by the stopping section.

3. The feeder according to claim 2 wherein,
an obstructing plate that prevents the carrier tape from being inserted into the tape insertion section is provided on the entrance retaining member, the obstructing plate being moved to a position that does not allow the carrier tape to be inserted into the tape insertion section when the entrance retaining member is raised by the rotation of the lever.

4. The feeder according to claim 2, further provided with
a first sensor that detects that the first carrier tape has been inserted into the tape insertion section,
a second sensor that detects operation of the lever, and
a third sensor that detects the second carrier tape has been inserted into the tape insertion section.

5. A feeder comprising:
a tape feeding path for feeding carrier tape that stores many components;
a tape insertion section that is provided on a rear section of a feeder main body and into which the carrier tape is inserted;
a sprocket that is rotatably provided on the feeder main body and that includes an engaging protrusion engageable with an engaging hole of the carrier tape inserted into the tape insertion section;
a motor that rotates the sprocket;
an entrance retaining member that presses the carrier tape inserted into the tape insertion section towards the tape feeding path;
a rotatable lever configured to raise the entrance retaining member to enable insertion of the carrier tape into the tape insertion section; and
a stopper member that regulates the insertion position of the carrier tape inserted into the tape insertion section to be a specified position when the entrance retaining member is raised by the rotation of the lever, wherein, an obstructing plate that prevents the carrier tape from being inserted into the tape insertion section is provided on the entrance retaining member, the obstructing plate being moved to a position that does not allow the carrier tape to be inserted into the tape insertion section when the entrance retaining member is raised by the rotation of the lever.

6. A feeder comprising:

a tape feeding path for feeding carrier tape that stores many components;

a tape insertion section that is provided on a rear section of a feeder main body and into which the carrier tape is inserted;

a sprocket that is rotatably provided on the feeder main body and that includes an enraging protrusion engageable with an engaging hole of the carrier tape inserted into the tape insertion section;

a motor that rotates the sprocket;

an entrance retaining member that presses the carrier tape inserted into the tape insertion section towards the tape feeding path;

a rotatable lever configured to raise the entrance retaining member to enable insertion of the carrier tape into the tape insertion section;

a stopper member that regulates the insertion position of the carrier tape inserted into the tape insertion section to be a specified position when the entrance retaining member is raised by the rotation of the lever;

a first sensor that detects that the first carrier tape has been inserted into the tape insertion section;

a second sensor that detects operation of the lever; and a third sensor that detects the second carrier tape has been inserted into the tape insertion section.

* * * * *